United States Patent
Ohtsuka et al.

(10) Patent No.: US 9,841,439 B2
(45) Date of Patent: Dec. 12, 2017

(54) ELECTROMAGNETIC WAVE IDENTIFICATION METHOD AND IDENTIFICATION DEVICE

(71) Applicant: KYUSHU INSTITUTE OF TECHNOLOGY, Fukuoka (JP)

(72) Inventors: Shinya Ohtsuka, Fukuoka (JP); Toshitake Umegane, Fukuoka (JP); Hiroki Shibata, Fukuoka (JP)

(73) Assignee: KYUSHU INSTITUTE OF TECHNOLOGY, Fukuoka (JP)

( * ) Notice: Subject to any disclaimer, the term of this patent is extended or adjusted under 35 U.S.C. 154(b) by 379 days.

(21) Appl. No.: 14/413,529

(22) PCT Filed: Aug. 15, 2013

(86) PCT No.: PCT/JP2013/071952
§ 371 (c)(1),
(2) Date: Jan. 8, 2015

(87) PCT Pub. No.: WO2014/038364
PCT Pub. Date: Mar. 13, 2014

(65) Prior Publication Data
US 2015/0177279 A1   Jun. 25, 2015

(30) Foreign Application Priority Data
Sep. 5, 2012 (JP) ................... 2012-194809

(51) Int. Cl.
*G01R 31/12* (2006.01)
*G01R 13/00* (2006.01)
(Continued)

(52) U.S. Cl.
CPC ......... *G01R 13/00* (2013.01); *G01R 31/1272* (2013.01); *H01H 33/26* (2013.01); *H01H 33/53* (2013.01)

(58) Field of Classification Search
CPC .... G01R 13/00; G01R 31/1272; G01R 31/08; G01R 31/12; G01R 31/083; H01H 33/26; H01H 33/53
See application file for complete search history.

(56) References Cited

U.S. PATENT DOCUMENTS 8,547,279 B2 * 10/2013 Tokuhiro ................ G01S 3/146
                                                                342/453
2009/0146666 A1 * 6/2009 Ohtsuka ............. G01R 31/1272
                                                                324/536
2011/0181472 A1   7/2011 Tokuhiro et al.

FOREIGN PATENT DOCUMENTS

JP    2003-043094 A    2/2003
JP    2005-024439 A    1/2005
(Continued)

OTHER PUBLICATIONS

Toshitaka Umegane, Hiroki Shibata, Shinya Ohtsuka; "Joint study group for discharge, dielectric-insulation material, and high voltage", ED-12-025, DEI-12-0367, HV-12-025 (2012).
(Continued)

*Primary Examiner* — Huan Tran
(74) *Attorney, Agent, or Firm* — McGlew and Tuttle, P.C.

(57) ABSTRACT

An electromagnetic wave identification device includes a detection section for detecting an electromagnetic wave signal which is output from an antenna for detecting electromagnetic waves and whose level is equal to or greater than a predetermined level; a measurement and record section for recording and storing the detected electromagnetic wave waveform data; and an analysis and evaluation section for receiving the recorded and stored electromagnetic wave waveform data, normalizing the electromagnetic wave waveform data by an maximum amplitude value to obtain normalized data, and determining whether or not the received electromagnetic wave is a direct wave by reference
(Continued)

to the normalized data. The analysis and evaluation section determines whether or not the received electromagnetic wave is a direct wave by obtaining a kurtosis from a histogram of amplitude values of the normalized data and determining whether or not the kurtosis is equal to or greater than a predetermined threshold, or by obtaining a normal probability plot from the normalized data and determining whether a value of the normalized data at a predetermined probability is equal to or greater than, or equal to or less than, a predetermined threshold.

8 Claims, 10 Drawing Sheets

(51) Int. Cl.
*H01H 33/26* (2006.01)
*H01H 33/53* (2006.01)

(56) References Cited

FOREIGN PATENT DOCUMENTS

| JP | 4015384 B2 | 11/2007 |
| JP | 2011-053055 A | 3/2011 |
| WO | 2010/038468 A1 | 4/2010 |

OTHER PUBLICATIONS

Toshitake Umegane et al., "Basic Research on Propagation Properties of Discharge-emitted Electromagnetic waves Around High Voltage Apparatus in the Substation", Denki Gakki Hoden Kenkyukai Shiryo, Jan. 28, 2013 (Jan. 28, 2013), vol. ED-13, No. 1-10, pp. 13-17.

* cited by examiner

POSITION (P1) WHICH CAN BE SEEN FROM RECEIVING ANTENNA

POSITION (P5) WHICH CANNOT BE SEEN FROM RECEIVING ANTENNA

POSITION (P1) WHICH CAN BE SEEN FROM RECEIVING ANTENNA

POSITION (P5) WHICH CANNOT BE SEEN FROM RECEIVING ANTENNA

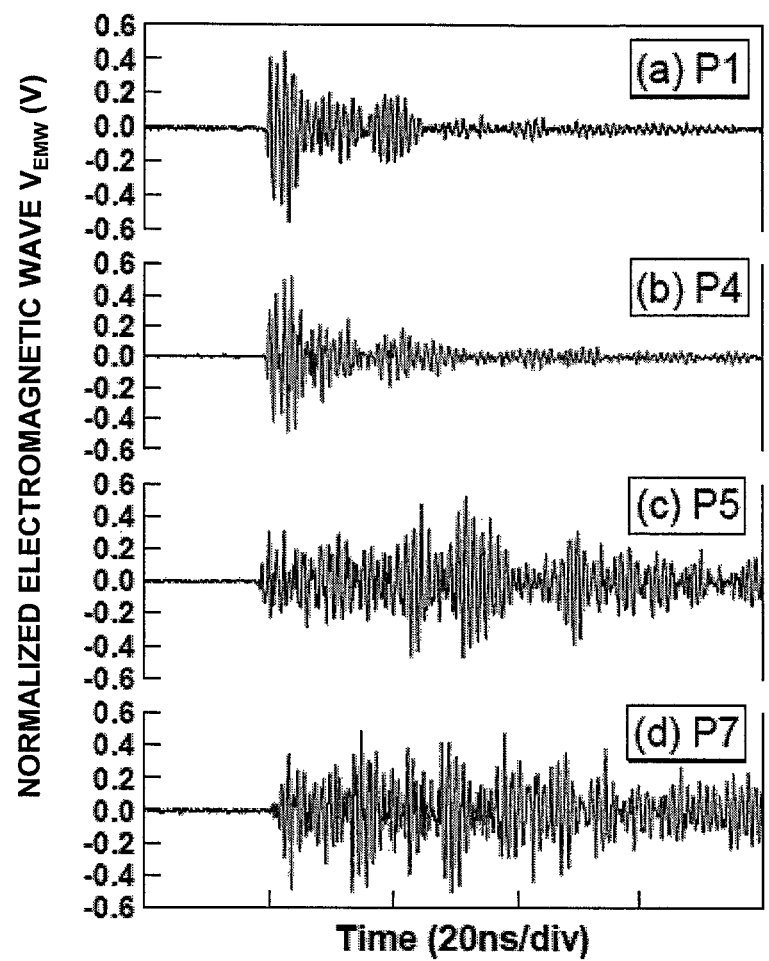

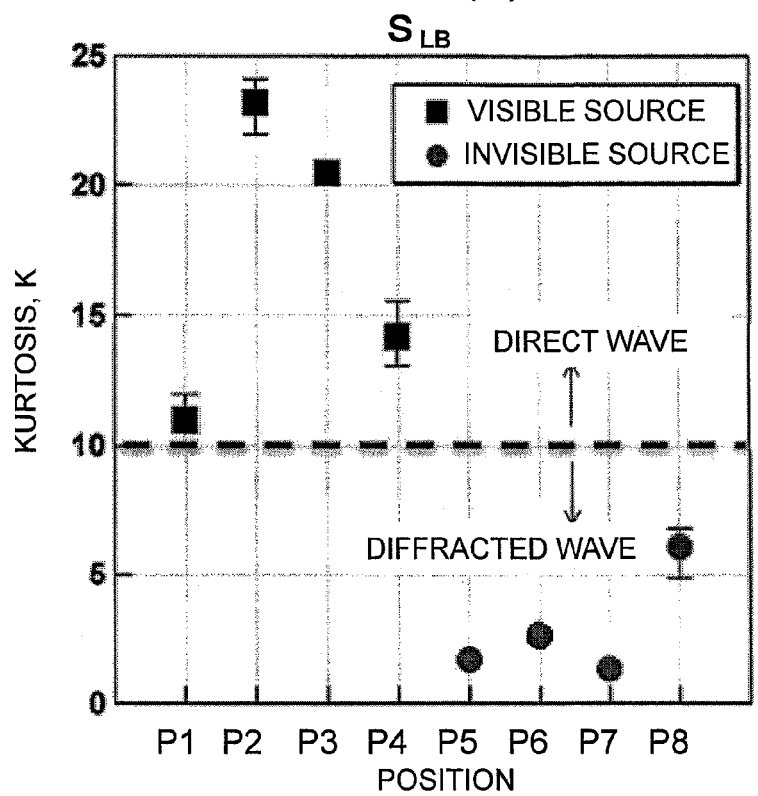
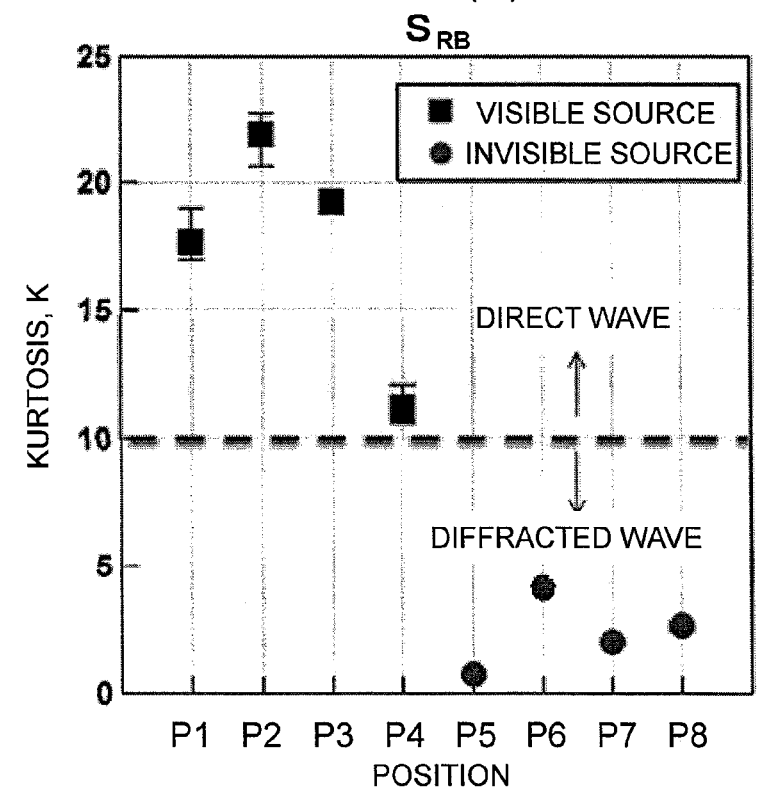

ELECTROMAGNETIC WAVE IDENTIFICATION METHOD AND IDENTIFICATION DEVICE

This application claims the benefit of PCT International Application Number PCT/JP2013/071952 filed on Aug. 15, 2013 and Japanese Application No. 2012-194809 filed on Sep. 5, 2012 in Japan, the disclosures of which are incorporated herein by reference.

TECHNICAL FIELD

The present invention relates to an electromagnetic wave discrimination (identification) method and an electromagnetic wave discrimination (identification) device which receive an electromagnetic wave radiated from a radiation source and determine whether or not the electromagnetic wave is a direct wave.

BACKGROUND ART

Electric power facilities are required to have high reliability, and a technique for detecting an electrical anomaly in an early stage and evaluating its state is demanded. At the present, when an electrical insulation anomaly of a device occurs, an attempt is made to detect an electromagnetic wave radiated from discharge caused by the insulation anomaly, and to make a determination as to whether or not the device is anomalous and/or evaluate its state on the basis of information of the detected waveform. In particular, an UHF method which detects electromagnetic waves in the UHF band has drawn people's attention.

In a gas insulated device such as a gas insulated switchgear (GIS) or a gas insulated transmission line (GIL), a space between the high-voltage center conductor and the metal ground tank is usually exposed to an electric field of high intensity. Therefore, when a partial discharge occurs in such a device, the insulation between the center conductor and the metal tank may be broken; i.e., dielectric breakdown may occur, eventually. In view of this, there has been employed a diagnosis method of detecting an electromagnetic wave signal propagating within a gas insulated device in a stage of partial discharge, which is a harbinger of dielectric breakdown, and determining whether or not the electromagnetic wave signal is a signal attributable to the partial discharge (hereinafter referred to as a "partial discharge signal"), to thereby detect an insulation anomaly in advance. One of various proposed methods for detecting such a partial discharge signal is a UHF (Ultra High Frequency) method, which is considered to be the most useful for enhancing the reliability of such insulation diagnosis. In the UHF method, a high frequency electromagnetic wave of the UHF band (300 MHz to 3 GHz) is detected by an antenna which has sensitivity in this band.

Localization of a source which generates an electromagnetic wave originating from a discharge is performed by obtaining the position coordinates of a discharge source and the distance from an antenna (see Patent Documents 1 and 2). Patent Document 1 discloses a radio interferometer system which can obtain the arrival angle of an electromagnetic wave from an electromagnetic wave generation source. In the case where the electromagnetic wave source is located in a horizontal plane, the radio interferometer system obtains the arrival angle through use of two antennas. In the case where the azimuth and elevation angles are also needed or in the case where the position coordinates of the electromagnetic wave source are also needed, a plurality of antenna pairs are used. Namely, three or more antennas are disposed in order to obtain the three dimensional coordinates of the generation source and the distances from the antennas. The three dimensional coordinates and the distances are obtained on the basis of differences in arrival time among the antennas (point localization).

In the case where a building is present between a generation source and a detection sensor, the following problem occurs. Even when an electromagnetic wave in the UHF band is generated behind the building, diffraction allows detection of the radiated electromagnetic wave in the UHF band. However, since the diffracted wave is influenced by diffraction and scattering caused by the building, its waveform differs from the original waveform. Therefore, in the case where the generation position or state of a discharge is evaluated on the basis of a diffracted wave, there arises a problem in that the generation position or state cannot be evaluated correctively. Therefore, discrimination between a diffracted wave and a direct wave is important, and a desire has arisen to know or determine whether a detected waveform is a diffracted wave or a direct wave. The accuracy of diagnosis and the reliability of the results of diagnosis can be enhanced by the knowledge of whether a diagnosis technique is applied to the waveform of a diffracted wave or the waveform of a direct wave.

PRIOR ART DOCUMENTS

Patent Documents

Patent Document 1: Japanese Patent No. 4015384
Patent Document 2: Japanese Patent Application Laid-Open (kokai) No. 2011-53055

Non-Patent Document

Non-patent Document 1: Toshitaka Umegane Hiroki Shibata, Shinya Ohtsuka; Joint study group for discharge, dielectric-insulation material, and high voltage, ED-12-025, DEI-12-0367, HV-12-025 (2012)

SUMMARY OF THE INVENTION

Problems to be Solved by the Invention

An object of the present invention is to enable detection of an electromagnetic wave while determining whether or not the detected electromagnetic wave is a direct wave. Another object is to apply a technique of selectively detecting a direct wave as described above to all of a plurality of diagnosis devices, each of which evaluates the anomalous state of a piece of equipment from a detected electromagnetic wave and an electromagnetic wave visualization device which determines the location of an electromagnetic wave generation source, to thereby enhance the reliability of evaluation.

Means for Solving the Problems

An electromagnetic wave identification method of the present invention—which receives an electromagnetic wave radiated from a radiation source and determines whether or not the electromagnetic wave is a direct wave—comprises detecting an electromagnetic wave signal whose level is equal to or greater than a predetermined level; recording and storing the detected electromagnetic wave waveform data; and normalizing the recorded and stored electromagnetic wave waveform data by an maximum amplitude value to obtain normalized data, and determining whether or not the received electromagnetic wave is a direct wave by reference to the normalized data. The determination as to whether or not the received electromagnetic wave is a direct wave is performed by obtaining a kurtosis from a histogram of amplitude values of the normalized data and determining whether or not the kurtosis is equal to or greater than a predetermined threshold. Alternatively, the determination as to whether or not the received electromagnetic wave is a direct wave is performed by obtaining a normal probability plot from the normalized data and determining whether a value of the normalized data at a predetermined probability is equal to or greater than, or equal to or less than, a predetermined threshold or determining whether a probability at a predetermined normalized data value is equal to or greater than, or equal to or less than, a predetermined probability.

Also, an electromagnetic wave identification device of the present invention—which receives an electromagnetic wave radiated from a radiation source and determines whether or not the electromagnetic wave is a direct wave—comprises an antenna for detecting electromagnetic waves; a detection section for detecting an electromagnetic wave signal which is output from the antenna and whose level is equal to or greater than a predetermined level; a measurement and record section for recording and storing the electromagnetic wave waveform data detected by the detection section; and an analysis and evaluation section for receiving the electromagnetic wave waveform data recorded and stored by the measurement and record section, normalizing the recorded and stored electromagnetic wave waveform data by an maximum amplitude value to obtain normalized data, and determining whether or not the received electromagnetic wave is a direct wave by reference to the normalized data. The analysis and evaluation section determines whether or not the received electromagnetic wave is a direct wave by obtaining a kurtosis from a histogram of amplitude values of the normalized data and determining whether or not the kurtosis is equal to or greater than a predetermined threshold. Alternatively, the analysis and evaluation section determines whether or not the received electromagnetic wave is a direct wave by obtaining a normal probability plot from the normalized data and determining whether a value of the normalized data at a predetermined probability is equal to or greater than, or equal to or less than, a predetermined threshold or determining whether a probability at a predetermined normalized data value is equal to or greater than, or equal to or less than, a predetermined probability.

The analysis and evaluation section performs, on the basis of the result of the determination as to whether or not the electromagnetic wave is the direct wave, anomalous state diagnosis of evaluating and diagnosing an anomalous state of a piece of equipment on the basis of the detected electromagnetic wave or electromagnetic wave visualization of specifying a generation location of an electromagnetic wave generation source. Also, the result of the determination as to whether or not the electromagnetic wave is the direct wave performed by the analysis and evaluation section is output to an anomalous state diagnosing device which evaluates and diagnoses an anomalous state of a piece of equipment on the basis of the detected electromagnetic wave or an electromagnetic wave visualization device which specifies a generation location of an electromagnetic wave generation source.

The analysis and evaluation section determines whether the detected electromagnetic wave is a direct wave or a diffracted wave. The radiation source is a partial discharge generation source which is an electrical insulation anomalous location generated as a harbinger of insulation breakage in a high voltage power device, gaseous corona discharge, or electrostatic discharge (ESD) on a human body or an electric or electronic device.

Effects of the Invention

According to the present invention, it is possible to determine whether or not a detected electromagnetic wave from a radiation source is a direct wave. More specifically, an electromagnetic wave whose amplitude is equal to or greater than a trigger level is detected, and the waveform of the detected electromagnetic wave is processed and evaluated, whereby a determination (discrimination) can be made as to whether or not the detected electromagnetic wave is a direct wave. Therefore, when the selective evaluation of the direction wave is applied to a plurality of devices, each of which evaluate an anomalous state of a piece of equipment from the detected electromagnetic wave, the reliabilities of all the devices are improved.

Also, in the case where the present invention is applied to an electromagnetic wave visualization device which specifies the generation location of an electromagnetic wave generation source, when a diffracted wave is detected, the possibly that the position localization cannot be correctly evaluated is high. However, when a message "the result of localization based on a diffracted wave" is displayed by using the technique of the present invention which determines whether or not a detected electromagnetic wave waveform is a direct wave, the possibility of the result being erroneous can be known. Namely, in the case of the electromagnetic wave visualization device, when the result of visualization is displayed in an empty space or at a location where an electromagnetic wave is unlikely to be generated, the fact that the evaluation is erroneous can be easily understood. Meanwhile, in the case where a person performs localization without knowing that the detected electromagnetic wave is a diffracted wave and the result of visualization is erroneously displayed at a location where an electromagnetic wave is likely to be generated, the message "the result of localization based on a diffracted wave" is displayed so as to call person's attention to the possibility that the result is erroneous.

BRIEF DESCRIPTION OF DRAWINGS

FIGS. 3(A) and 3(B) are charts exemplifying measured electromagnetic wave waveforms, wherein FIG. 3(A) shows an electromagnetic wave waveform measured in a state in which an electromagnetic wave source is located at a position (P1) which can be seen from a receiving antenna, and FIG. 3(B) shows an electromagnetic wave waveform measured in a state in which the electromagnetic wave source is located at a position (P5) which cannot be seen from the receiving antenna.

FIGS. 4(A) and 4(B) are charts exemplifying the normalized waveforms of the detected electromagnetic waves, wherein FIG. 4(A) shows the normalized waveform of the electromagnetic wave measured in a state in which the electromagnetic wave source is located at the position (P1) which can be seen from a receiving antenna, and FIG. 4(B) shows the normalized waveform of the electromagnetic wave measured in a state in which the electromagnetic wave source is located at the position (P5) which cannot be seen from the receiving antenna.

FIGS. 5(A) and 5(B) are histograms of amplitude values, wherein FIG. 5(A) shows a histogram made from the normalized waveform (see FIG. 4(A) of the electromagnetic wave measured in a state in which the electromagnetic wave source is located at the position (P1) which can be seen from a receiving antenna, and FIG. 5(B) shows a histogram made from the normalized waveform (see FIG. 4(B) of the electromagnetic wave measured in a state in which the electromagnetic wave source is located at the position (P5) which cannot be seen from the receiving antenna.

FIG. 8 is a chart showing the notarized waveforms of the measured electromagnetic waves shown in FIG. 7.

FIG. 9(A) is a graph showing, for each of measurement points, a kurtosis K obtained from the distribution of amplitude value histogram of the normalized waveform of an electromagnetic wave measured by a left antenna SLB, and FIG. 9(B) is a graph showing, for each of the measurement points, a kurtosis K obtained from the distribution of the amplitude value histogram of the normalized waveform of an electromagnetic wave measured by a right antenna SRB.

MODE FOR CARRYING OUT THE INVENTION

Figure 1:
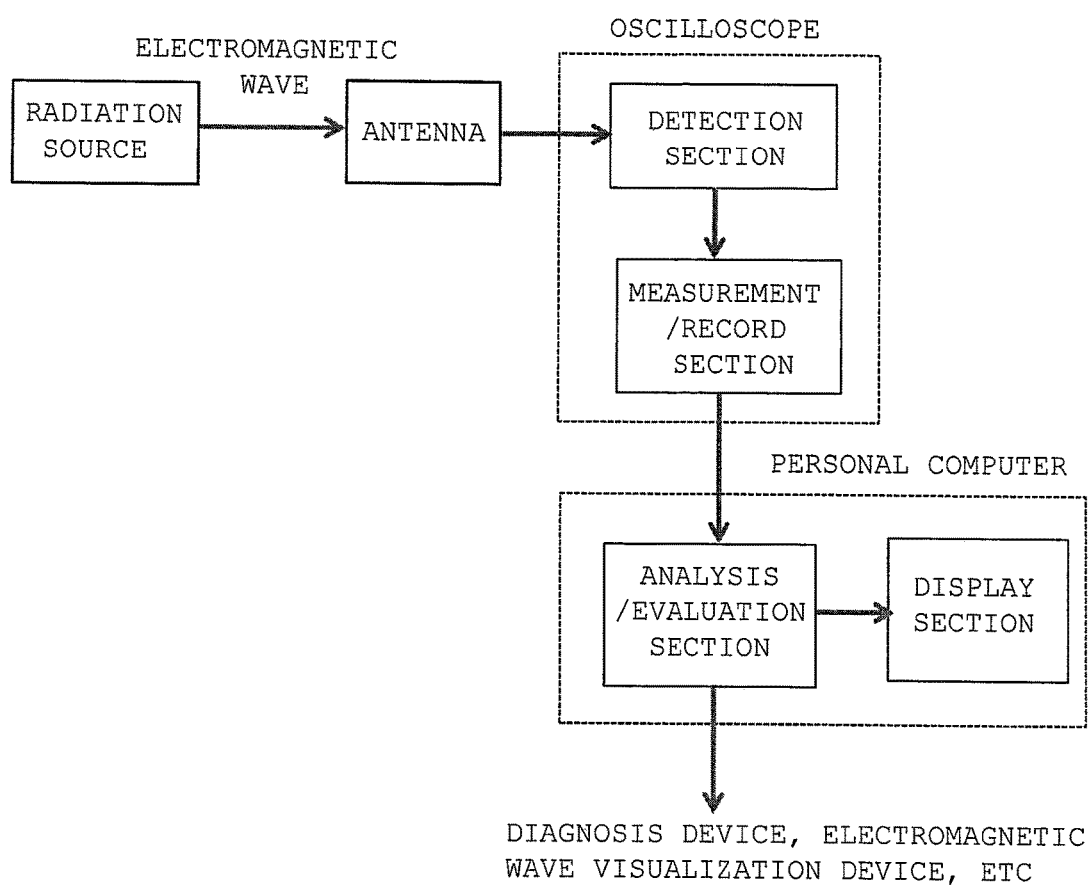
FIG. 1 is a schematic diagram showing a discrimination device of the present invention for discriminating a direct wave and a diffracted wave which are electromagnetic waves.

The present invention will now be described by way of examples. FIG. 1 is a schematic diagram showing a discrimination device of the present invention for discriminating a direct wave and a diffracted wave which are electromagnetic waves. The present invention can be applied to a UHF method or a like method used for a gas insulated devices such as a gas insulated switchgear (GIS) or a gas insulated transmission line (GIL). According to the UHF method or the like, an electromagnetic wave signal propagating within the gas insulated device in a stage of partial discharge which is a harbinger of dielectric breakdown is detected, and a determination is made as to whether or not the electromagnetic wave signal is a partial discharge signal. Therefore, the radiation source shown in FIG. 1 is, for example, an electromagnetic wave which originates from a partial discharge generated inside a piece of equipment and which leaks to the outside of the piece of equipment through an electromagnetic wave opening of a spacer, a bushing, or the like serves as a generation source. However, as will be described later, an experiment was carried out by using an ESD gun as a radiation source. The experiment was carried out in a state in which the ESD gun was selectively disposed at positions which can be seen from an antenna and positions which cannot be seen from the antenna such as positions behind a piece of equipment. The antenna for detecting electromagnetic waves is, for example, a horn antenna having a directivity and sensitivity in the UHF band. A detection section and a measurement/record section can be realized by an oscilloscope. The detection section detects an electromagnetic wave signal from the antenna whose level is equal to or higher than a trigger level, and the measurement/record section records and stores the detected electromagnetic wave waveform.

An analysis/evaluation section and a display section can be realized by a personal computer. Data of the electromagnetic wave waveform detected and recorded by the measurement/record section are input to the analysis/evaluation section. The analysis/evaluation section: 1) normalizes the waveform data by the maximum amplitude value; and 2) obtains a kurtosis K from a histogram of the amplitude values of the data, and determines whether or not the electromagnetic wave is a direct wave by determining whether or not the value of K is equal to or greater than a prescribed threshold. Alternatively, the analysis/evaluation section: 3) obtains normal probability plots from the normalized data obtained in the above-described step 1), and determines whether or not the electromagnetic wave is a direct wave by determining whether or not the value of the data at a certain probability is equal to or greater (or less) than a prescribed threshold. Notably, in contrast to the above, a determination as to whether or not the electromagnetic wave is a direct wave can be made by determining whether or not the probability at a certain value of the data is equal to or greater (or less) than a prescribed threshold. The display section displays the results of the evaluation or determination.

The results of the determination performed by the analysis/evaluation section as to whether or not the detected electromagnetic wave is a direct wave can be output to an external device such as an electromagnetic wave visualization device or a device for diagnosing an anomalous state of a piece of equipment. The results of the determination as to whether or not the detected electromagnetic wave is a direct wave can be also output to any external diagnosis device which evaluates and diagnoses an anomalous state of a piece of equipment from a detected electromagnetic wave. As a result, in the case of a diagnosis device which evaluates an anomalous state of a piece of equipment, the reliability of the device can be improved by selectively evaluating the direct wave. Alternatively, the results of the determination as to whether the detected electromagnetic wave is a direct wave can be output to an electromagnetic wave visualization device. Thus, the electromagnetic wave visualization device can correctly perform position localization for specifying the generation location of an electromagnetic wave generation source. Alternatively, instead of performing the diagnosis of an anomalous state of a piece of equipment and the visualization of an electromagnetic wave in an external device, these can be performed by the analysis/evaluation section within the personal computer.

The present inventors repeated an experiment of measuring electromagnetic waves while disposing an ESD gun (a radiation source) at a position which can be seen directly from a receiving antenna and a position which cannot be seen from the receiving antenna (for details, see Example 1 which will be described later), and found that the following difference is present between the case where the ESD gun is disposed at the position which can be seen directly from the receiving antenna and the case where the ESD gun is disposed at the position which cannot be seen from the receiving antenna.

1) When the waveform of a diffracted wave is compared with the waveform of a direct wave, the signal intensity of the diffracted wave is lower than that of the direct wave. Notably, the in the present specification, the "direct wave" is used as a term which means an electromagnetic wave propagating between two positions which can be seen from each other.

2) The diffracted wave is longer than the direct wave in terms of the duration of the waveform amplitude.

The above-described phenomenon 1) allows discrimination between the diffracted wave and the direct wave on the basis of the strength of a detection signal if the strength of a generated signal is constant at all times. However, in general, a discharge signal is not constant. Therefore, the diffracted wave and the direct wave cannot be discriminated from each other through mere comparison therebetween in terms of the strength of the detection signal. In the case where each signal was normalized by the maximum amplitude value and its integrated value was evaluated in consideration of the above-described phenomena 1) and 2), the diffracted wave and the direct wave could be discriminated from each other in some cases. However, under certain conditions of a propagation path, a remarkable difference was not observed.

Through comparison between the normalized waveform of the diffracted wave and the normalized waveform of the direct wave, it was found that each of the two waveforms has line symmetry with respect to a time axis at which the amplitude value is zero and has substantially the same positive and negative amplitudes and that, whereas the amplitude of the diffracted wave continues, the amplitude value of the direct wave does not continues and frequently assumes values near zero. From this fact, the present inventors found an evaluation index for discriminating the direct wave and the diffracted wave from each other.

Figure 2:
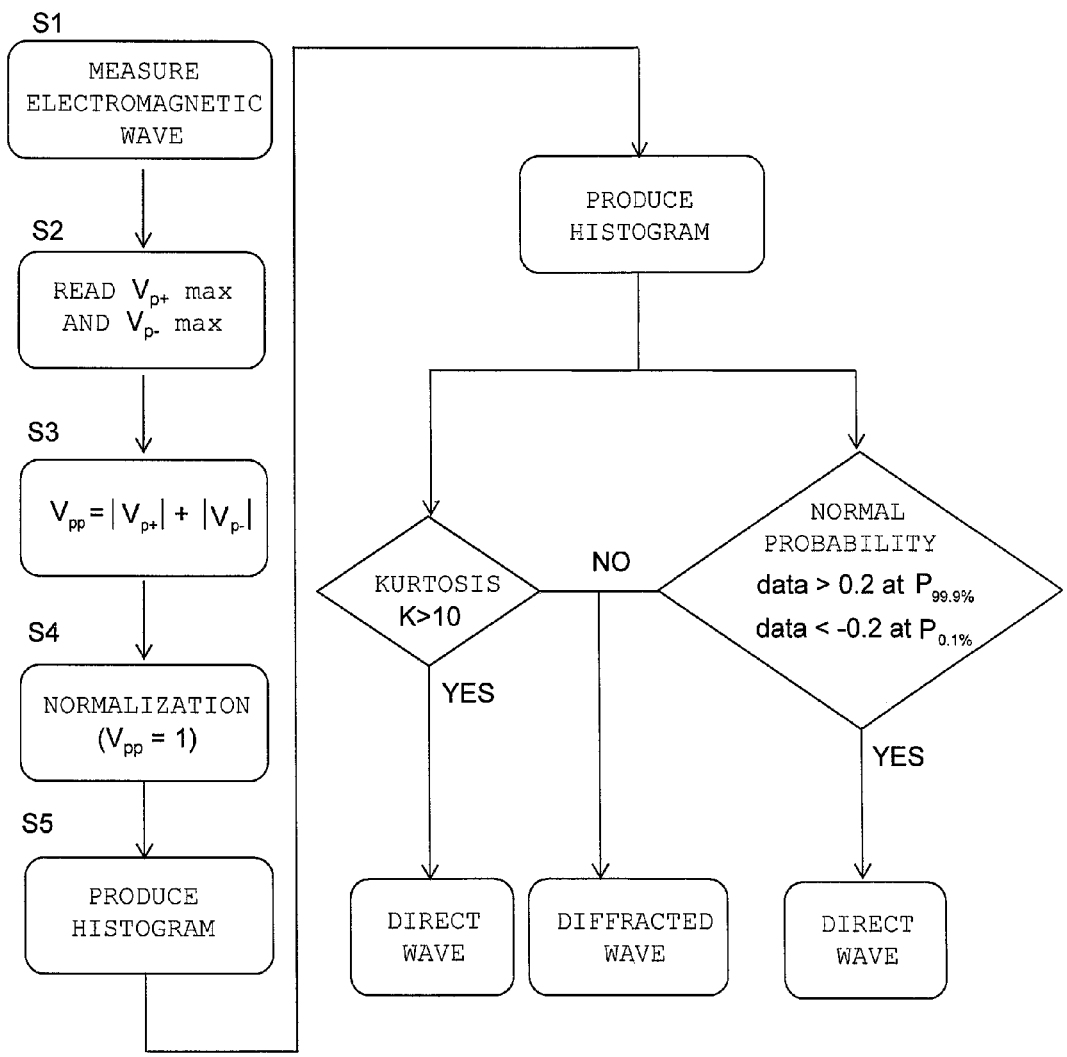
FIG. 2 is a flowchart used for describing a method of discriminating a direct wave and a diffracted wave from each other.
Figure 3A:
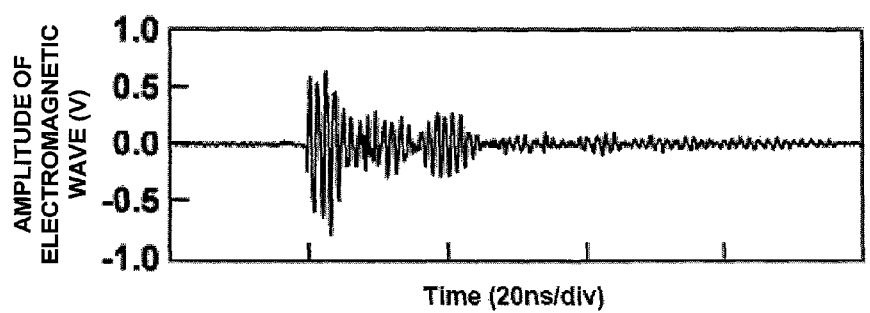
Figure 3B:
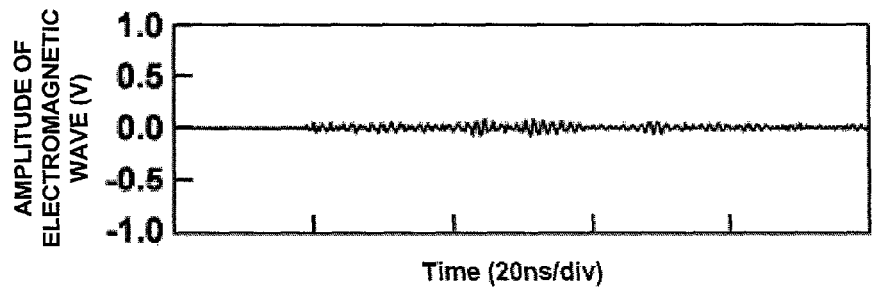

FIG. 2 is a flowchart used for describing a method of discriminating a direct wave and a diffracted wave from each other. First, in step S1, an electromagnetic wave is measured. FIGS. 3(A) and 3(B) are charts exemplifying measured electromagnetic wave waveforms, wherein FIG. 3(A) shows an electromagnetic wave waveform measured in a state in which an electromagnetic wave source is located at a position (P1) which can be seen from a receiving antenna, and FIG. 3(B) shows an electromagnetic wave waveform measured in a state in which the electromagnetic wave source is located at a position (P5) which cannot be seen from the receiving antenna. The output of the receiving antenna is detected and recorded by a waveform measurement device (e.g., a waveform observation device such as an oscilloscope). In the case where the waveform measurement device is a measuring instrument having a trigger function such as an oscilloscope, a signal whose level is greater than its trigger level is repeatedly measured until the number of times of measurement; i.e., the number of times of trigger, reaches a predetermined number, and the detected waveforms are recorded.

Next, in step S2 shown in FIG. 2, Vp+max (an amplitude which is the maximum in the plus direction; i.e., the maximum value of the positive value) and Vp−max (an amplitude which is the maximum in the minus direction; i.e., the minimum value of the negative value) are read from the measured electromagnetic wave waveform. In step S3, the maximum amplitude value Vpp(=|Vp+|+|Vp−|) is obtained through computation. Next, in step S4, the amplitude value Vpp of the detected electromagnetic wave during a certain measurement time (e.g., 100 ns) is normalized. Namely, with the obtained maximum amplitude value Vpp been set to 1, the waveform of the detected electromagnetic wave within each wave section (each cycle) is normalized using the peak value in the plus direction and the peak value in the minus direction. Each peak value can be obtained by a general algorithm for obtaining the maximum and minimum values of a waveform. According to such an algorithm, the values of the waveform data at different points are compared, whereby the maximum and minimum values are obtained. The number of data sets of each amplitude value can be obtained from the normalized waveform data by using the general histogram function of graph software or statistical analysis software.

Figure 4A:
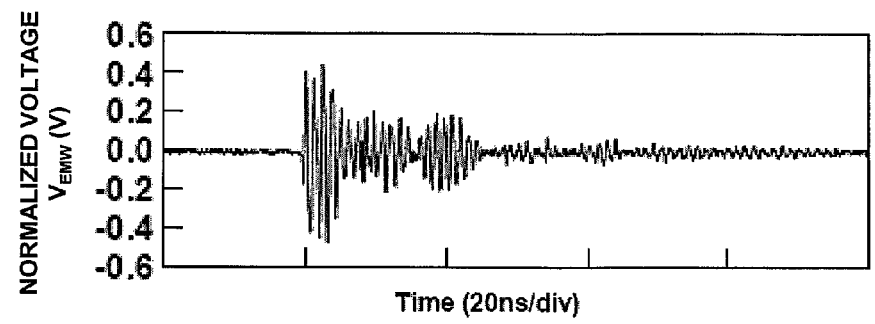
Figure 4B:
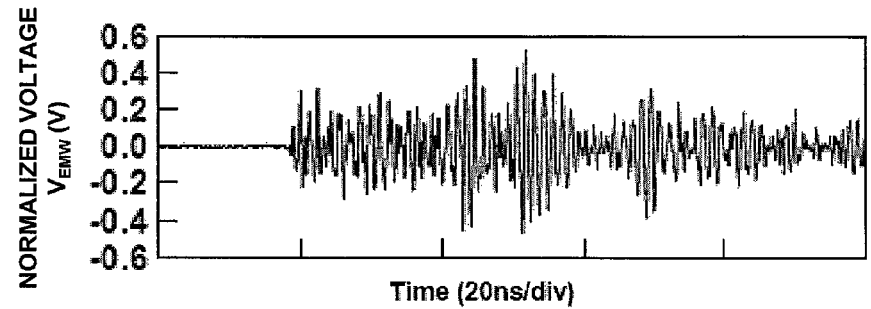

FIGS. 4(A) and 4(B) are charts exemplifying the normalized waveforms of the detected electromagnetic waves, wherein FIG. 4(A) shows the normalized waveform of the electromagnetic wave measured in a state in which an electromagnetic wave source is located at the position (P1) which can be seen from the receiving antenna, and FIG. 4(B) shows the normalized waveform of the electromagnetic wave measured in a state in which the electromagnetic wave source is located at the position (P5) which cannot be seen from the receiving antenna. When normalization is not performed, it becomes difficult to determine a criteria for evaluation based on the absolute value, because the magnitude of the generated signal changes depending on the discharge phenomenon and the propagation distance. In step S5 of FIG. 2, a histogram is produced on the basis of the amplitude value of the normalized waveform.

Figure 5A:
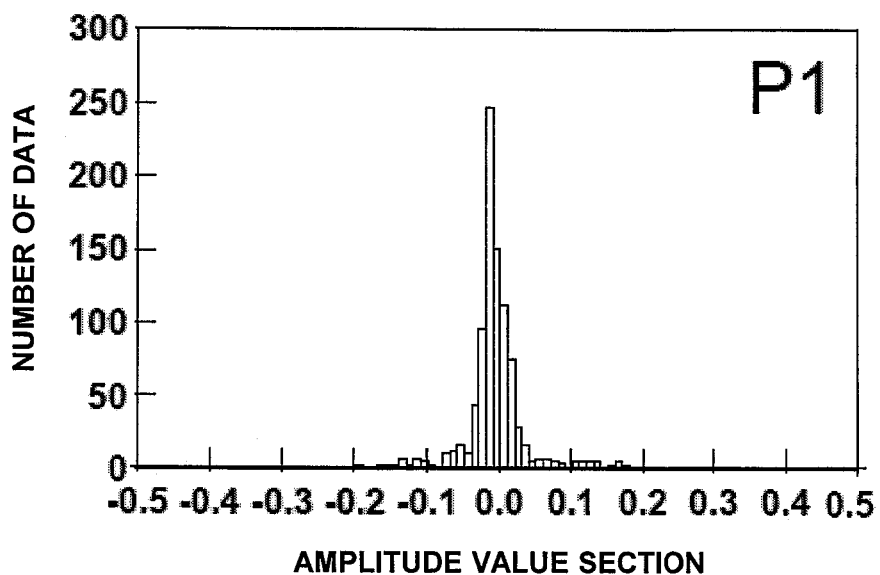
Figure 5B:
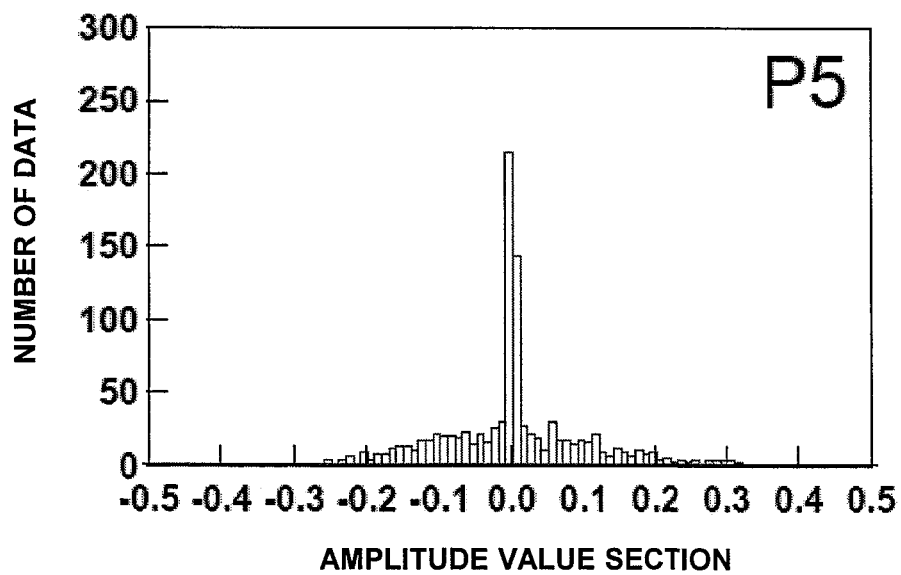

FIGS. 5(A) and 5(B) are histograms of amplitudes, wherein FIG. 5(A) shows a histogram made from the normalized waveform (see FIG. 4(A) of the electromagnetic wave measured in a state in which an electromagnetic wave source is located at the position (P1) which can be seen from the receiving antenna, and FIG. 5(B) shows a histogram made from the normalized waveform (see FIG. 4(B) of the electromagnetic wave measured in a state in which the electromagnetic wave source is located at the position (P5) which cannot be seen from the receiving antenna. The measured electromagnetic wave waveform is normalized by the maximum amplitude value Vpp, and the occurrence frequency of each amplitude value of the normalized waveform is represented by a histogram. In each histogram, the horizontal axis represents amplitude value sections (here, each section has a width of 0.01) of the normalized waveform data. The amplitude value is zero at the center of the horizontal axis. The vertical axis represents the frequency; i.e., the number of data sets, in each amplitude value section.

As shown in FIG. 5, in the case of the direct wave from the position P1 which can be seen from the receiving antenna, the number of data sets is large in the vicinity of the position where the normalization amplitude value is 0. In contrast, in the case of the diffracted wave from the position P5 which cannot be seen from the receiving antenna, since the amplitude continues, the distribution expands from the vicinity of the position where the normalization amplitude value is 0. Namely, the direct wave has a higher distribution kurtosis as compared with the diffracted wave. As a result of performance of a diffraction experiment in an actual substation (see Example 1 to be described later), the inventors found an evaluation criteria based on the kurtosis which allows discrimination between the direct wave and the diffracted wave. Alternatively, evaluation can be performed by using a normal probability distribution as an evaluation criteria, instead of using the kurtosis.

1) Determination on the Basis of Kurtosis

Discrimination is performed in accordance with the "kurtosis K" (statistic) calculated from the distribution of the normalized amplitude value histogram. In the case where a large number of data sets are distributed at the center of the histogram at which the normalization amplitude value is zero; i.e., the distribution is sharp, the detected wave is a direct wave. In the case where data sets are also distributed, substantially symmetrically, around the position at which the amplitude value is zero; i.e., the degree of sharpness of the distribution is smaller than that of the direct wave, the detected wave is determined to be a diffracted wave. Namely, when the kurtosis K is large (e.g., K>10), the detected wave is determined to be a direct wave. When the kurtosis K is equal to or less than 10, the detected wave is determined to be a diffracted wave.

A general calculation formula for obtaining the kurtosisis as follows. It is assumed that the normalized amplitude values of N data sets (x1, x2, . . . , xN) which represent the respective normalized amplitude values of a waveform are given by a variable xi as shown below. S represents the standard deviation.

The kurtosis K is represented by the following formula.

[Mathematical Expression 1]
$$K = \frac{\sum_{i=1}^{N}(x_i - \bar{x})^4}{NS^4} \quad \bar{x}: \text{average value}$$

2) Determination on the Basis of Normal Probability Distribution

In accordance with the distribution of normal probability plots of the histogram of the normalized amplitude values, discrimination is performed on the basis of the magnitude of the value of each normalized amplitude data set at a certain probability (see FIG. 10 which will be described later). Namely, in the case where the value at a position where the probability is 0.1% is smaller than −0.2 or the case where the value at a position where the probability is 99.9% is greater than +0.2, the detected wave is determined to be a direct wave. In other cases, the detected wave is determined to be a diffracted wave. The normal probability distribution can be obtained by using, for example, the normal probability plotting function of graph software (Excel or Kaleida-Graph). The normal probability plot is used so as to determine whether or not data sets have a normal distribution. Data sets whose distribution is close to the normal distribution are generally distributed on a straight line. Accordingly, whereas the diffracted wave whose distribution is close to the normal distribution exhibits a distribution generally extending along a straight line, the direct wave exhibits a deviation from a straight line because the distribution of the direct wave differs from the normal distribution.

EXAMPLE 1

Figure 6:
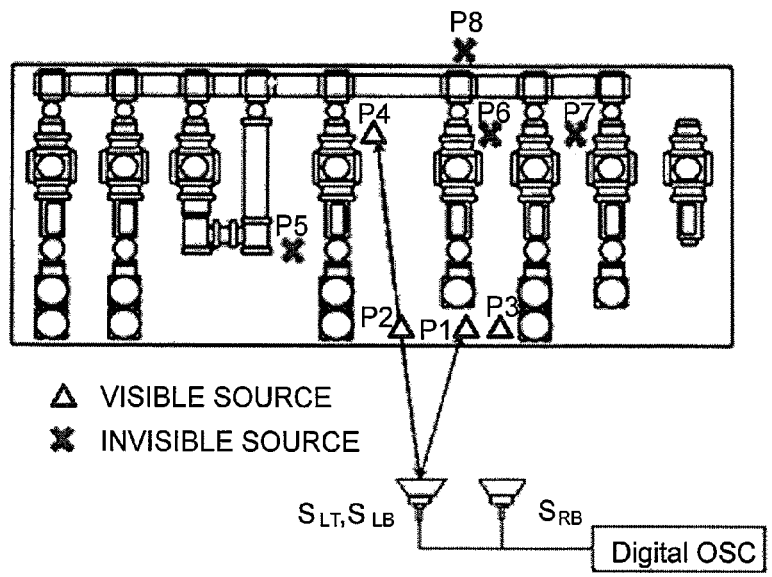
FIG. 6 is a view showing positions of an ESD gun in a GIS peripheral facility.

An experiment for proving the present invention was performed around a gas insulated switchgear (GIS) facility of 220 kV in an outdoor substation. FIG. 6 is a view showing positions of an ESD gun in a GIS peripheral facility. In the experiment, the positions of receiving antennas were fixed, and the position of a radiation electromagnetic wave source (ESD gun) was changed. Three antennas; i.e., a lower right antenna SRB, a lower left antenna SLB, and an upper left antenna SLT, were disposed as the receiving antennas. As shown in FIG. 6, a test was performed in a state in which the ESD gun (radiation source) was selectively disposed at each of 8 positions in total; i.e., positions (P1 to P4) at which the ESD gun (radiation source) could be seen directly from the receiving antenna, and positions (P5 to P8) at which the ESD gun could not be seen directly from the receiving antenna.

Measurement of electromagnetic waves was performed by using antennas having sensitivity in a frequency band to be used (for example, when the UHF band is used, a horn antenna is used), a coaxial cable which is small in loss, an apparatus capable of detecting and recording waveforms such as a digital oscilloscope (a segment memory such as that used in the FastFrame mode is used), and an analysis/evaluation section and a display section which can analyze, evaluate, and display the measured waveform data, like a personal computer. The Fast Frame mode is the name of a function provided in oscilloscopes of Tektronix, and is a technique of recording data at a high sampling rate by a designated number of times within a certain period of time at the instant when the sampling operation is triggered and saving memory by stopping the data recording during a period during which the sampling operation is not triggered (performing measurement at a high sampling rate for a long period of time).

An aluminum wire of φ 0.25 mm connected to the ground terminal was disposed in the vicinity of a discharge electrode at the distal end of an ESD gun portion of an electrostatic discharge tester (a tester main body: Noiseken, ESS-2002EX, an ESD gun portion: Noiseken, TC-815-R. Hereinafter, this electrostatic discharge tester will be referred to as an ESD gun), and gap discharge was generated between the wire and the discharge electrode, whereby electromagnetic waves were generated. This ESD gun used a CR unit (C=330 pF, R=2 kΩ), and a fixed positive voltage of 10 kV was used as a charge voltage Vc. The radiated electromagnetic wave was measured as follows in the UHF band. A horn antenna (Schwarzbeck, BBHA9120A) whose frequency range is 750 MHz to 5 GHz was connected to a digital oscilloscope (Tektronix, DP07254, 2.5 GHz, 40 GS/s) through a coaxial cable. The electromagnetic wave was measured by using the FastFrame mode of the oscilloscope (trigger event N=40 times).

Figure 7:
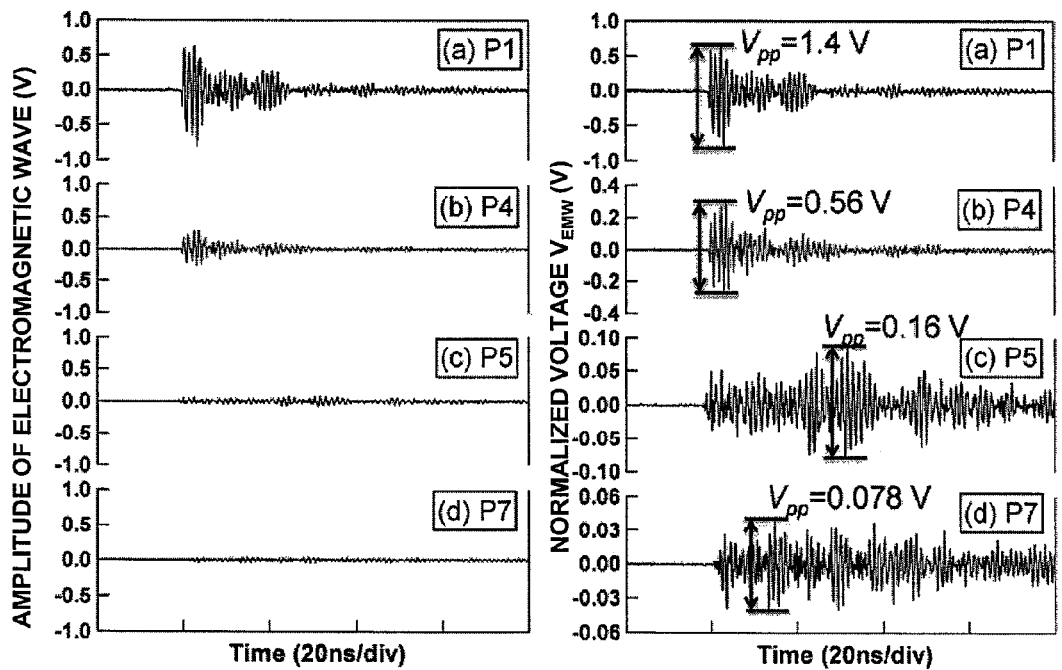
FIG. 7 is a set of charts showing electromagnetic wave waveforms measured when the ESD gun is disposed at positions P1, P4, P5, and P7 shown in FIG. 6.

FIG. 7 is a set of charts showing electromagnetic wave waveforms measured when the ESD gun was disposed at positions P1, P4, P5, and P7 shown in FIG. 6. The waveforms on the right side in FIG. 7, excluding the uppermost waveform (P1), are enlarged in the direction of the vertical axis. As shown in FIG. 7, an electromagnetic wave waveform can be detected even in the case where the ESD gun (radiation source) is disposed at P5 or P7 which are positions determined such that the radiation source cannot be seen directly. Its waveform greatly differs from those obtained in the case where the ESD gun (radiation source) is disposed at P1 or P4 which are positions determined such that the radiation source can be seen directly. Namely, it is found that although the amplitude value (V) of the electromagnetic wave is small, its amplitude duration time is long. This shows that the electromagnetic wave propagated as a diffracted wave. Accordingly, the present result shows that even when discharge occurs behind a piece of equipment, a radiated electromagnetic wave can be detected because the radiated electromagnetic wave propagates while diffracting. FIG. 8 is a chart showing the notarized waveforms of the measured electromagnetic waves shown in FIG. 7. The notarized waveforms (time domain of about 100 ns) shown in FIG. 8 are used for producing histograms.

FIG. 9(A) is a graph showing, for each of measurement points, the kurtosis K obtained from the distribution of the amplitude value histogram of the normalized waveform of the electromagnetic wave measured by the left antenna SLB, and FIG. 9(B) is a graph showing, for each of measurement points, the kurtosis K obtained from the distribution of the amplitude value histogram of the normalized waveform of an electromagnetic wave measured by the right antenna SRB. The amplitude value histogram of the normalized waveform of each electromagnetic wave was obtained as described above. In each of the graph shown in FIG. 9(A) (antenna SLB) and the graph shown in FIG. 9(B) (antenna SRB), whereas the kurtosis K obtained from the result of measurement in a state in which the ESD gun was disposed at the positions (P1 to P4) determined such that the ESD gun could be seen from the receiving antenna (that is, the kurtosis K obtained in the case where the detected wave was a direct wave) was greater than 10, the kurtosis K obtained from the result of measurement in a state in which the ESD gun was disposed at the positions (P5 to P8) determined such that the ESD gun could not be seen from the receiving antenna (that is, the kurtosis K obtained in the case where the detected wave was a diffracted wave) was less than 10. Accordingly, when the kurtosis K is large (e.g., K>10), the detected waveform can be determined to be a direct wave. When the kurtosis K is equal to or less than 10, the detected waveform can be determined to be a diffracted wave.

Figure 10A:
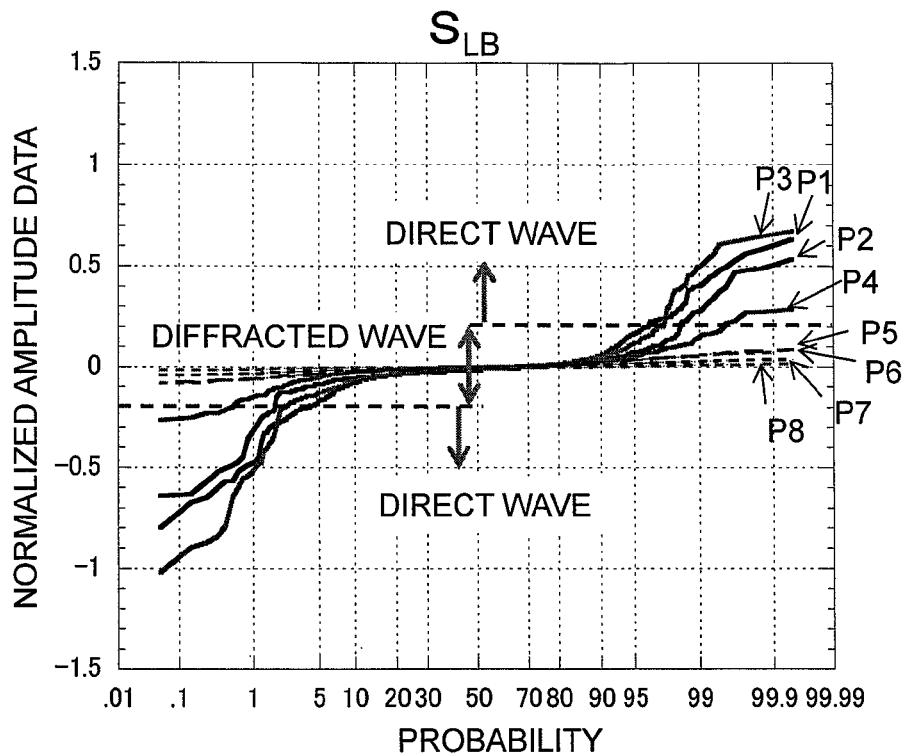
FIG. 10(A) is a graph showing, for each of the measurement positions, the distribution of normal probability plots of the amplitude value histogram of the normalized waveform of the electromagnetic wave measured by the left antenna SLB.
Figure 10B:
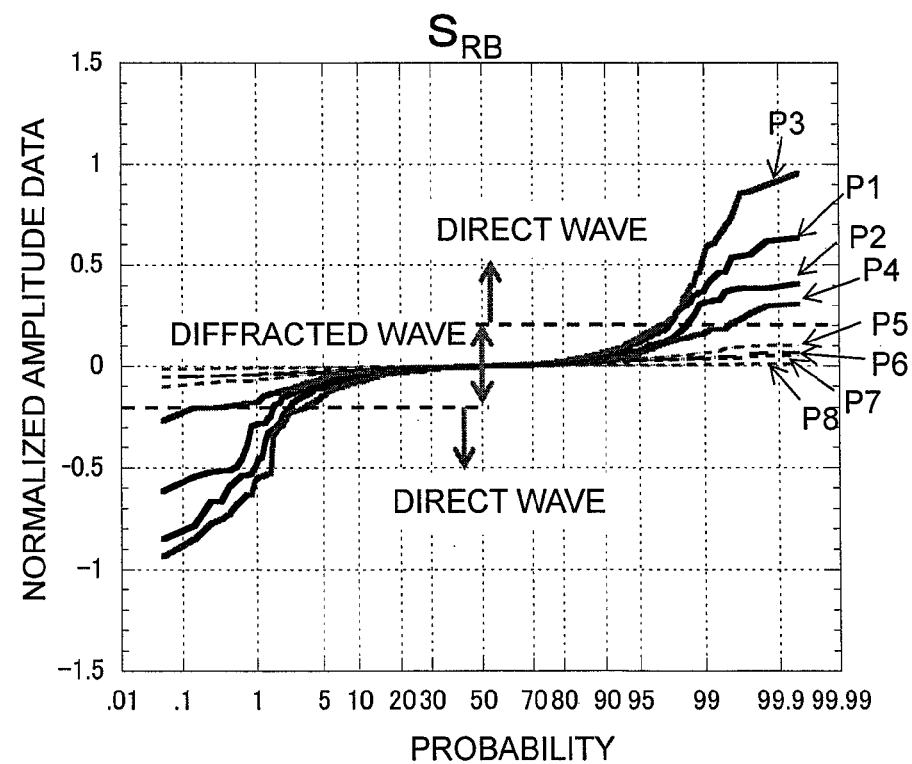
FIG. 10(B) is a graph showing, for each of the measurement positions, the distribution of normal probability plots of the amplitude value histogram of the normalized waveform of an electromagnetic wave measured by the right antenna SRB.

FIG. 10(A) is a graph showing, for each of measurement positions, the distribution of normal probability plots of the amplitude value histogram of the normalized waveform of the electromagnetic wave measured by the left antenna SLB, and FIG. 10(B) is a graph showing, for each of measurement positions, the distribution of normal probability plots of the amplitude value histogram of the normalized waveform of an electromagnetic wave measured by the right antenna SRB. The amplitude value histogram of the normalized waveform of each electromagnetic wave was obtained as described above. The normal probability plot is used so as to determine whether or not data sets have a normal distribution. Whereas a diffracted wave whose distribution is close to the normal distribution exhibits a distribution generally extending along a straight line, a direct wave exhibits a deviation from a straight line because the distribution of the direct wave differs from the normal distribution. In FIG. 10, the horizontal axis shows probability (cumulative relative frequency), and the vertical axis shows the values of data (normalized amplitude values). The probability (cumulative relative frequency) is a value obtained by dividing the sum of frequencies (the number of data sets) in data sections up to a certain data section by the total number of data sets. In accordance with the distribution of normal probability plots of the amplitude value histogram, the discrimination between the direct wave and the diffracted wave can be performed on the basis of the magnitude of the value of each normalized amplitude data set at a certain probability. Namely, in the case where the value at a position where the probability is 0.1% is smaller than −0.2 or the case where the value at a position where the probability is 99.9% is greater than +0.2, the detected wave can be determined to be a direct wave. In other cases, the detected wave can be determined to be a diffracted wave.

Figure 11:
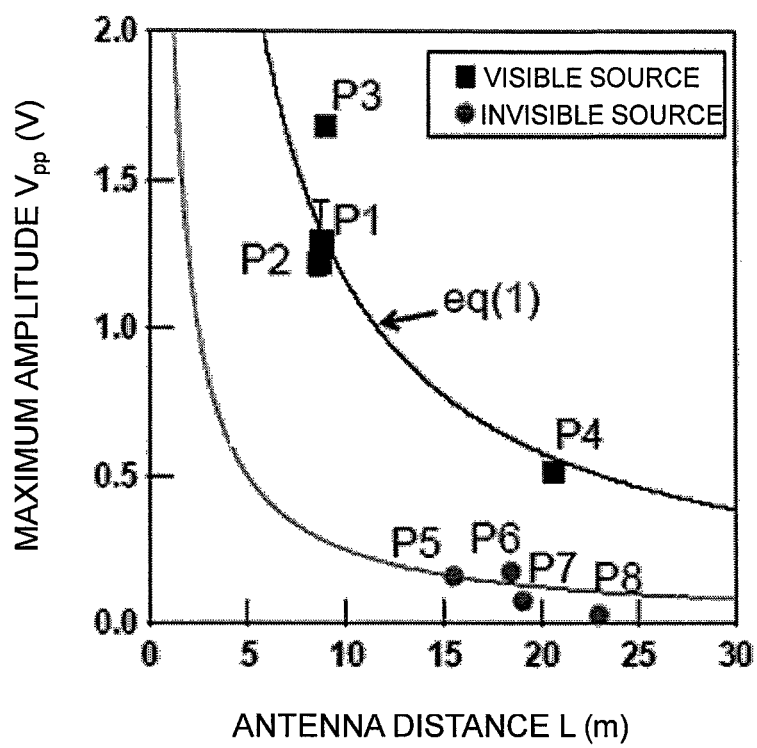
FIG. 11 is a graph showing the dependency of the maximum amplitude value Vpp on the antenna distance L at each ESD gun position.

FIG. 11 is a graph showing the dependency of the maximum amplitude value Vpp on the antenna distance L at each ESD gun position. It is known from the previous studies that the dependency of the amplitude value Vpp (V) of a direct electromagnetic wave in the present measurement device on the antenna distance L (m) is represented by Eq (1): Vpp=1.16 Vc/L (Vc is a charge voltage (kV) of the ESD gun) (see Non-patent Document 1). FIG. 11 shows that the results of P1 to P4 well match the characteristics of direct waves. Meanwhile, the results of P5 to P8 (in which the detected waves are considered to be diffracted waves) show that the maximum amplitude values Vpp are ⅕ of the corresponding maximum amplitude values Vpp of the direct waves and that their characteristic curve differs from the characteristic curve of the direct waves.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

The invention claimed is:

1. An electromagnetic wave identification method of receiving an electromagnetic wave radiated from a radiation source and determining whether or not the electromagnetic wave is a direct wave, comprising:
   detecting an electromagnetic wave signal whose level is equal to or greater than a predetermined level;
   recording and storing the detected electromagnetic wave waveform data; and
   normalizing the recorded and stored electromagnetic wave waveform data by a maximum amplitude value to obtain normalized data, and determining whether or not the received electromagnetic wave is a direct wave by reference to the normalized data, wherein
   the determination as to whether or not the received electromagnetic wave is a direct wave is performed by obtaining a kurtosis from a histogram of amplitude values of the normalized data and determining whether or not the kurtosis is equal to or greater than a predetermined threshold, or by obtaining a normal probability plot from the normalized data and determining whether a value of the normalized data at a predetermined probability is equal to or greater than, or equal to or less than, a predetermined threshold or determining whether a probability at a predetermined normalized data value is equal to or greater than, or equal to or less than, a predetermined probability.

2. An electromagnetic wave identification method according to claim 1, wherein an anomalous state diagnosis of evaluating and diagnosing an anomalous state of a piece of equipment on the basis of the detected electromagnetic wave or electromagnetic wave visualization of specifying a generation location of an electromagnetic wave generation source is performed on the basis of the result of the determination as to whether or not the electromagnetic wave is the direct wave.

3. An electromagnetic wave identification method according to claim 1, wherein a determination as to whether the received electromagnetic wave is a direct wave or a diffracted wave is made by determining whether or not the detected electromagnetic wave is the direct wave.

4. An electromagnetic wave identification device for receiving an electromagnetic wave radiated from a radiation source and determining whether or not the electromagnetic wave is a direct wave, comprising:
   an antenna for detecting electromagnetic waves;
   a detection section for detecting an electromagnetic wave signal which is output from the antenna and whose level is equal to or greater than a predetermined level;

a measurement and record section for recording and storing the electromagnetic wave waveform data detected by the detection section; and an analysis and evaluation section for receiving the electromagnetic wave waveform data recorded and stored by the measurement and record section, normalizing the recorded and stored electromagnetic wave waveform data by an maximum amplitude value to obtain normalized data, and determining whether or not the received electromagnetic wave is a direct wave by reference to the normalized data, wherein the analysis and evaluation section determines whether or not the received electromagnetic wave is a direct wave by obtaining a kurtosis from a histogram of amplitude values of the normalized data and determining whether or not the kurtosis is equal to or greater than a predetermined threshold, or by obtaining a normal probability plot from the normalized data and determining whether a value of the normalized data at a predetermined probability is equal to or greater than, or equal to or less than, a predetermined threshold or determining whether a probability at a predetermined normalized data value is equal to or greater than, or equal to or less than, a predetermined probability.

5. An electromagnetic wave identification device according to claim 4, wherein the analysis and evaluation section performs, on the basis of the result of the determination as to whether or not the electromagnetic wave is the direct wave, anomalous state diagnosis of evaluating and diagnosing an anomalous state of a piece of equipment on the basis of the detected electromagnetic wave or electromagnetic wave visualization of specifying a generation location of an electromagnetic wave generation source.

6. An electromagnetic wave identification device according to claim 4, wherein the result of the determination as to whether or not the electromagnetic wave is the direct wave performed by the analysis and evaluation section is output to an anomalous state diagnosing device which evaluates and diagnoses an anomalous state of a piece of equipment on the basis of the detected electromagnetic wave or an electromagnetic wave visualization device which specifies a generation location of an electromagnetic wave generation source.

7. An electromagnetic wave identification device according to claim 4, wherein the analysis and evaluation section determines whether the received electromagnetic wave is a direct wave or a diffracted wave.

8. An electromagnetic wave identification device according to claim 4, wherein the radiation source is a partial discharge generation source at an electrical insulation anomalous location generated as a harbinger of insulation breakage in a high voltage power device, gaseous corona discharge, or electrostatic discharge (ESD) on a human body or an electric or electronic device.

* * * * *